US007550374B2

(12) United States Patent
Song et al.

(10) Patent No.: US 7,550,374 B2
(45) Date of Patent: Jun. 23, 2009

(54) THIN FILM ELECTRODE FOR FORMING OHMIC CONTACT IN LIGHT EMITTING DIODES AND LASER DIODES USING NICKEL-BASED SOLID SOLUTION FOR MANUFACTURING HIGH PERFORMANCE GALLIUM NITRIDE-BASED OPTICAL DEVICES, AND METHOD FOR FABRICATING THE SAME

(75) Inventors: June-o Song, Kwangju-si (KR); Dong-suk Leem, Kwangju-si (KR); Tae-yeon Seong, Kwangju-si (KR)

(73) Assignees: Samsung Electronics Co., Ltd., Suwon-Si, Gyeonggi (KR); Kwangju Institute of Science and Technology, Buk-Gu, Kwangju-Si (KR)

( * ) Notice: Subject to any disclaimer, the term of this patent is extended or adjusted under 35 U.S.C. 154(b) by 247 days.

(21) Appl. No.: 11/265,098

(22) Filed: Nov. 3, 2005

(65) Prior Publication Data
US 2006/0102920 A1 May 18, 2006

Related U.S. Application Data

(62) Division of application No. 10/801,823, filed on Mar. 17, 2004, now Pat. No. 6,989,598.

(30) Foreign Application Priority Data
May 7, 2003 (KR) .......................... 10-2003-29073

(51) Int. Cl.
H01L 21/3205 (2006.01)
H01L 21/28 (2006.01)
(52) U.S. Cl. ................ 438/604; 438/605; 257/E21.062

(58) Field of Classification Search ................. 257/743, 257/E21.062; 438/604, 605
See application file for complete search history.

(56) References Cited

U.S. PATENT DOCUMENTS 6,078,064 A 6/2000 Ming-Jiunn et al.

(Continued)

FOREIGN PATENT DOCUMENTS

CN 1330416 A 1/2002

(Continued)

OTHER PUBLICATIONS

A. Azens et al., "Highly Transparent Ni-Mg and Ni-V-Mg Oxide Films For Electrochromic Applications", Thin Solid Films, Elsevier Science B.V., May 14, 2002, pp. 1-3 (cited in the specification).

(Continued)

Primary Examiner—Asok K Sarkar
(74) Attorney, Agent, or Firm—Buchanan Ingersoll & Rooney PC

(57) ABSTRACT

Disclosed herein is a technique for forming a high quality ohmic contact utilizable in the fabrication of short-wavelength light emitting diodes (LEDs) emitting blue and green visible light and ultraviolet light, and laser diodes (LDs) using a gallium nitride (GaN) semiconductor.

The ohmic contact is formed by depositing a nickel (Ni)-based solid solution on top of a p-type gallium nitride semiconductor. The ohmic contact thus formed has an excellent current-voltage characteristic and a low specific contact resistance due to an increased effective carrier concentration around the surface of the gallium nitride layer, as well as a high transmittance in the short-wavelength region.

9 Claims, 7 Drawing Sheets

U.S. PATENT DOCUMENTS

| | | | |
|---|---|---|---|
| 6,169,297 B1 * | 1/2001 | Jang et al. | 257/99 |
| 6,281,526 B1 | 8/2001 | Nitta et al. | |
| 6,649,942 B2 * | 11/2003 | Hata et al. | 257/103 |
| 6,693,352 B1 | 2/2004 | Huang et al. | |
| 2002/0185732 A1 | 12/2002 | Ho et al. | |

FOREIGN PATENT DOCUMENTS

| | | |
|---|---|---|
| JP | 11-040846 A | 2/1999 |
| JP | 2001-035796 | 2/2001 |
| KR | 2000-1665 A | 1/2000 |
| KR | 2002-79513 A | 10/2002 |

OTHER PUBLICATIONS

M.H.G. Jacobs et al., "A Critical Thermodynamic Evaluation of The System MG-NI", Pergamon, Calphad vol. 22, No. 4, pp. 513-525, 1998 (cited in the specification).

*Korean Office Action dated Jan. 5, 2006 (with English translation).

Chinese Office Action dated Jul. 20, 2007 issued in Chinese Patent Application No. 2004-10031246.1 with English Translation.

Callister Jr., William D., Materials Science and Engineering: An Introduction (2003), pp. 776 and 787.

* cited by examiner

THIN FILM ELECTRODE FOR FORMING OHMIC CONTACT IN LIGHT EMITTING DIODES AND LASER DIODES USING NICKEL-BASED SOLID SOLUTION FOR MANUFACTURING HIGH PERFORMANCE GALLIUM NITRIDE-BASED OPTICAL DEVICES, AND METHOD FOR FABRICATING THE SAME

BACKGROUND OF THE INVENTION

This application claims the priority of Korean Patent Application No. 2003-29073, filed on May 7, 2003, in the Korean Intellectual Property Office, the disclosure of which is incorporated herein by reference in its entity.

1. Field of the Invention

The present invention relates to a technique for forming a high quality ohmic contact with improved current injection and spreading capabilities, as well as low ohmic contact resistance and high transmittance. The technique for forming a high quality ohmic contact is one of the key techniques for the fabrication of short-wavelength light emitting diodes (LEDs) emitting blue and green visible light and ultraviolet light, and laser diodes (LDs) using a gallium nitride (GaN) semiconductor.

2. Description of the Related Art

The formation of a high quality ohmic contact between a semiconductor and an electrode is very important to manufacture photo-related devices using a gallium nitride semiconductor such as light emitting diodes and laser diodes.

Hitherto, in the case of p-type gallium nitride, thin film electrodes based on nickel (Ni), e.g., a thin metal film of nickel/gold (Ni/Au), have been widely used as thin film electrode structures for ohmic contact. Recently, a variety of metal systems for ohmic contact such as Ni/Pt/Au, Pt/Ni/Au, Pd/Au, etc., are being developed.

However, there are some problems in the formation of a high quality ohmic contact using p-type gallium nitride. Among these problems, hydrogen atoms (H) of ammonia (NH$_3$), which is an atmospheric gas used for growing p-type gallium nitride, bind with magnesium (Mg) as a p-type dopant to form a Mg—H complex exhibiting electric insulating properties, thereby exhibiting a low effective carrier concentration and a high surface resistance. Accordingly, the formation of a high quality ohmic contact is difficult. Moreover, a low carrier (hole) injection makes the manufacture of high grade optical devices difficult.

One example for increasing the doping concentration of p-type gallium nitride is disclosed in Japanese Patent Laid-open No. 2001-35796. According to this publication, gallium nitride having an increased carrier concentration is obtained by bring a metal, e.g., zirconium (Zr), having a high hydrogen affinity into contact with the gallium nitride, followed by activating a p-type dopant present in a crystal of the gallium nitride through annealing. As another example, nickel, gold-zinc alloy and gold (Ni/Au—Zn/Au) are sequentially deposited on a gallium nitride layer to form an ohmic contact.

Another problem is that no high quality ohmic contact systems having a high transmittance in the short-wavelength region have been developed. A nickel/gold (Ni/Au) system currently employed in the LED process has a very thin thickness (<~100 Å) and a transmittance of 80% or more. The ohmic contact using such a thin metal layer can achieve high transmittance, but it is difficult to obtain a sufficient current injection and spreading capabilities, causing low efficiency of optical devices.

SUMMARY OF THE INVENTION

Thus, the present inventors have conducted intensive research to realize a high-grade ohmic contact system. As a result, the present inventors have found that when a nickel (Ni)-based solid solution is deposited on top of a p-type gallium nitride semiconductor and then annealed near the melting point of a solubilized metal element such as magnesium (Mg) or zinc (Zn), an excellent doping effect of magnesium (Mg) and zinc (Zn) on the surface of the gallium nitride layer can be obtained, effective carrier concentration around the surface of the gallium nitride layer can be increased by the formation of a number of gallium vacancies due to reaction with gallium, or an energy band between the gallium nitride and deposited oxidized material can be controlled. These improvements allow the high-grade ohmic contact system to exhibit an excellent current-voltage characteristic and a low specific contact resistance, as well as a high transmittance in the short-wavelength region.

In addition, the present inventors tried to accomplish the following five technical objects. As a result, the present inventors realized the formation of a high-grade ohmic contact based on a new concept using a Ni—X solid solution, which is different from previously developed techniques. The technical objects performed by the present inventors are as follows:

① Increased effective carrier concentration on the surface of gallium nitride: Mg—H bonds are broken using the excellent hydrogen affinity of the Ni—X solid solution;

② High light transmittance in the short-wavelength region and large work function: a small amount of an X element is added to nickel oxide (NiO) to form a Ni—X oxide (Ni$_x$A$_y$O) [A. Azens et al., Thin Solid Films 422, 2002, 1];

③ Excellent doping effect: the X element solubilized in the Ni—X solid solution is annealed. [M. H. G. Jacobs, P. J. Spencer, Calphad 22, 1998, 513];

④ Creation of a number of gallium vacancies: Ni as a matrix metal or the X element and gallium (Ga) are reacted to form a compound.

⑤ Formation of a high-grade ohmic contact based on an energy bandgap principle: a deposited Ni-based solid solution is annealed to form an oxide, which is advantageous in terms of easy formation of an ohmic contact of p-type gallium nitride.

The present inventors have found that when a Ni—Mg solid solution as a Ni—X solid solution is ohmic-contacted with p-type gallium nitride, superior results can be obtained compared to those reported so far, and accomplished the present invention.

Therefore, the object of the present invention is to provide an ohmic contact metal system with excellent electrical, optical, thermal and structural properties which exhibits an increased effective carrier concentration (①, ③ and ④), a reduced Schottky barrier through a controlled energy bandgap between materials (⑤) and a high transmittance (②).

In order to accomplish the above objects of the present invention, there is provided a thin film electrode for forming an ohmic contact in light emitting diodes or laser diodes which comprises a first electrode layer laminated on a p-type gallium nitride layer and including a Ni—X solid solution, and a second electrode layer laminated on the first electrode and including at least one element selected from the group consisting of Au, Pt, Pd, Ni, Ru, Rh, Re, C, Cu and Ir.

The thin film electrode of the present invention may further comprise a third electrode layer laminated on the second electrode layer and including at least one element selected from the group consisting of Al, Ag and Rh.

Alternatively, the third electrode layer laminated on the second electrode layer may include at least one compound selected from the group consisting of transparent conductive oxides and transparent conductive nitrides.

The thin film electrode of the present invention may further comprise a fourth electrode layer laminated on the third electrode layer and including at least one element selected from the group consisting of Al, Ag and Rh.

In accordance with one aspect of the present invention, there is provided a thin film electrode for forming an ohmic contact in light emitting diodes or laser diodes which comprises a first electrode layer laminated on a p-type gallium nitride layer and including at least one element selected from the group consisting of Au, Pt, Pd, Ni, Ru, Rh, Re, C, Cu and Ir, and a second electrode layer laminated on the first electrode and including a Ni—X solid solution.

The thin film electrode of the present invention may further comprise a third electrode layer laminated on the second electrode layer and including at least one element selected from the group consisting of Al, Ag and Rh.

Alternatively, the thin film electrode of the present invention may further comprise a third electrode layer laminated on the second electrode layer and including at least one compound selected from the group consisting of transparent conductive oxides and transparent conductive nitrides, and a fourth electrode layer laminated on the third electrode layer and including at least one element selected from the group consisting of Al, Ag and Rh.

In accordance with another aspect of the present invention, there is provided a thin film electrode for forming an ohmic contact in light emitting diodes or laser diodes which comprises a first electrode layer laminated on a p-type gallium nitride layer and including a Ni—X solid solution, and a second electrode layer laminated on the first electrode and including at least one compound selected from the group consisting of transparent conductive oxides and transparent conductive nitrides.

The thin film electrode of the present invention may further comprise a third electrode layer laminated on the second electrode layer and including at least one element selected from the group consisting of Al, Ag and Rh.

In accordance with another aspect of the present invention, there is provided a thin film electrode for forming an ohmic contact in light emitting diodes or laser diodes which comprises a first electrode layer laminated on a p-type gallium nitride layer and including a Ni—X solid solution, and a second electrode layer laminated on the first electrode and including at least one element selected from the group consisting of Al, Ag and Rh.

The Ni-based (Ni—X) solid solution used in the present invention includes nickel (Ni) as a matrix metal, and X including at least one element selected from the group consisting of group II elements, group VI elements, Sc, Y, Ge, Sn and Sb.

The group II elements include one element selected from the group consisting of Mg, Be, Ca and Zn.

The group VI elements include one element selected from the group consisting of S, Se and Te.

The X element constituting the Ni-based (Ni—X) solid solution is added in the amount of 1~49 atomic percentage (%).

The thickness of the electrode layer formed from the Ni-based solid solution is within the range of 1~1,000 Å. The overall thickness of the first, the second, the third, and the fourth electrode layers is within the range of 1~50,000 Å.

The p-type gallium nitride used in the present invention preferably has a composition of $Al_xIn_yGa_zN$ (where $0<x<1$, $0<y<1$, $0<z<1$, and $x+y+z=1$).

In accordance with yet another aspect of the present invention there is provided a method for fabricating the thin film electrodes on the p-type gallium nitride layer, comprising the steps of:

washing carbon and oxygen layers formed on a gallium nitride semiconductor to remove impurities therefrom;

depositing a nickel-based solid solution under a high vacuum of $2\times10^{-6} \sim 5\times10^{-8}$ torr using an electron beam evaporation, an electron ray evaporaion, a sputtering, a plasma laser deposition or an electrochemical process; and annealing the deposited nickel-based solid solution under air, oxygen or nitrogen atmosphere at 250~800° C for 30 seconds~1 hour.

BRIEF DESCRIPTION OF THE DRAWINGS

The above and other objects, features and other advantages of the present invention will be more clearly understood from the following detailed description taken in conjunction with the accompanying drawings, in which:

FIG. 4(a) represents the results prior to annealing, and FIG. 4(b) represents the results after annealing at 550° C. for 1 minute;

FIG. 7(a) represents the results prior to annealing, and FIG. 7(b) represents the results after annealing at 550° C. for 1 minute;

DESCRIPTION OF THE PREFERRED EMBODIMENTS

Hereinafter, the present invention will be explained in more detail with reference to the accompanying drawings.

Figure 1:
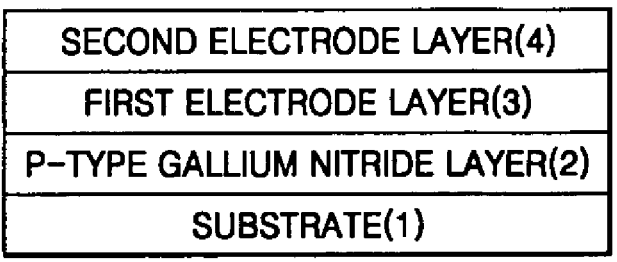
FIG. 1 is a schematic view showing a structure of a thin film electrode according to an embodiment (a first aspect) of the present invention.

FIG. 1 is a schematic view showing a structure of a thin film electrode according to an embodiment (first aspect) of the present invention.

Referring to FIG. 1, the thin film electrode comprises a first electrode layer 3 and a second electrode layer 4, wherein the electrode layers are laminated in this order on a gallium nitride layer 2 formed on a substrate 1.

Referring to FIG. 1, the first electrode layer 3 laminated on top of the p-type gallium nitride layer is an electrode for forming an ohmic contact of a p-type gallium nitride semiconductor. A solid solution usable herein includes an element capable of easily breaking Mg-H bonds within the gallium nitride semiconductor, exhibiting an excellent doping effect and forming gallium-related nitrides when annealed. Above all, the solid solution is a material which can form transparent conductive oxides capable of lowering the Schottky barrier when annealed based on an energy bandgap principle between materials and exhibit a high transmittance even in a thickness of 100 Å or more.

The solid solution in contact with the gallium nitride semiconductor can easily break Mg—H bonds within the gallium nitride semiconductor, exhibit an excellent doping effect or form a number of gallium vacancies around the surface of the gallium nitride layer when annealed at low temperature (800° C. or lower), thereby increasing effective carrier concentration around the surface of the gallium nitride layer.

The increased effective carrier concentration ($>10^{18}$ cm$^{-3}$) on the surface of the gallium nitride lowers the Schottky barrier present in the interface of the metal electrode in contact with the gallium nitride semiconductor so that a number of carriers (holes) can generate high carrier conductivity through a tunneling effect on the basis of quantum concept.

A representative example of the solid solution satisfying the requirements as discussed above is a Ni-based solid solution (Ni—X) which exhibits a strong hydrogen affinity. Examples of the X element contained in nickel (a matrix metal) include group II elements such as magnesium (Mg), beryllium (Be), calcium (Ca), zinc (Zn), etc., which serve as dopants of the p-type gallium nitride. When the elements are added to the nickel (Ni) matrix, they exist in a solubilized form at low temperature range rather than in a compound form. When annealed around a melting temperature of the elements following the deposition, the elements act as dopants or form a compound through the reaction with gallium to form a number of gallium vacancies like the nickel matrix metal. Accordingly, it is believed that a high quality ohmic contact having excellent electrical properties can be formed with ease.

As the X element added to the nickel (Ni) matrix metal, group VI elements, e.g., sulfur (S), selenium (Se) and tellurium (Te) can be used. Since the group VI elements also can replace nitrogen (N) of the gallium nitride, they act as dopants and form a gallium compound through the reaction with gallium to form a number of gallium vacancies. Accordingly, it is believed that a high quality ohmic contact having excellent electrical properties can be formed with ease. In addition to the group II and VI elements, antimony (Sb) and scandium (Sc) which are capable of forming a compound through the reaction with gallium at low temperature can be used as the X element.

The second electrode layer 4 is an outermost layer of the thin film electrode, and plays a role in ① inhibiting a surface degradation occurring during an annealing process for the manufacture of devices such as light emitting diodes and laser diodes, ② facilitating the formation of a gallium-related compound, ③ preventing nitrogen from flowing out, ④ obtaining excellent stability against oxidation and wire adhesion, and ⑤ maintaining a high transparency.

Representative examples of materials usable as the second electrode layer 4 satisfying the requirements as described above include ① pure metals, e.g., gold (Au), palladium (Pd), platinum (Pt), rhodium (Rh), rhenium (Re) and ruthenium (Ru), ② transparent conductive oxides (TCOs), e.g., indium tin oxide (ITO), doped zinc oxide (ZnO) and tin oxide (SnO$_2$), and ③ transparent conductive nitrides, e.g., TiN.

Figure 2:
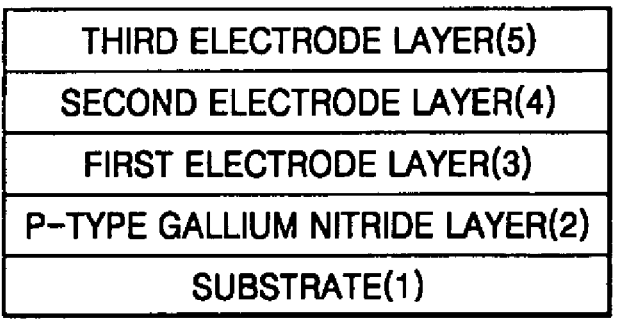
FIG. 2 is a schematic view showing a structure of a thin film electrode according to an embodiment (a second aspect) of the present invention.

FIG. 2 is a schematic view showing a structure of a thin film electrode according to an embodiment (a second aspect) of the present invention.

Referring to FIG. 2, the thin film electrode comprises a first electrode layer 3, a second electrode layer 4 and a third electrode layer 5, wherein the electrode layers are laminated in this order on a gallium nitride layer 2 formed on a substrate 1.

The first and the second electrode layers shown in FIG. 1 are usable in this embodiment. Accordingly, detailed descriptions of the first and the second electrode layers are intentionally omitted in the following description.

In particular, in order to maximize the light emitting efficiency of light emitting diodes (LEDs), an inverted structure (flip chip) to general LED structures is provided for the third electrode layer. To this end, conductive oxides or nitrides having an excellent light transmittance can be selected as materials of the third electrode layer.

Figure 3:
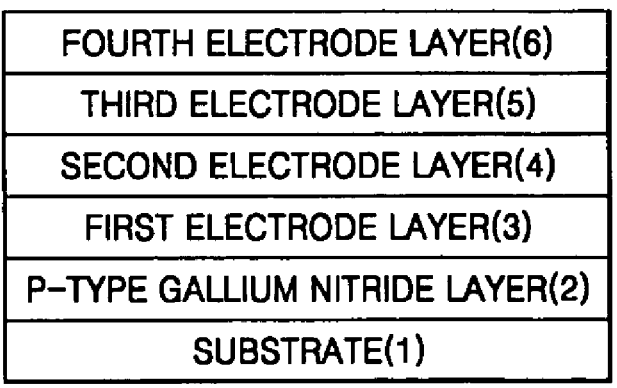
FIG. 3 is a schematic view showing a structure of a thin film electrode according to an embodiment (a third aspect) of the present invention.

FIG. 3 is a schematic view showing a structure of a thin film electrode according to an embodiment (a third aspect) of the present invention. Referring to FIG. 3, the thin film electrode comprises a first electrode layer 3, a second electrode layer 4, a third electrode layer 5 and a fourth electrode layer 6, wherein the electrode layers are laminated in this order on a gallium nitride layer 2 formed on a substrate 1.

The first, the second, and the third electrode layers shown in FIG. 2 are usable in this embodiment. Accordingly, detailed descriptions of the first, the second and the third electrode layers are intentionally omitted in the following description.

In particular, in order to maximize the light emitting efficiency of light emitting diodes (LEDs), an inverted structure (flip chip) to general LED structures is provided for the fourth electrode layer. To this end, highly reflective materials within the short-wavelength region can be selected as materials of the fourth electrode layer. At this time, highly reflective materials include at least one element selected from the group consisting of Al, Ag, Rh, etc.

Figure 4:
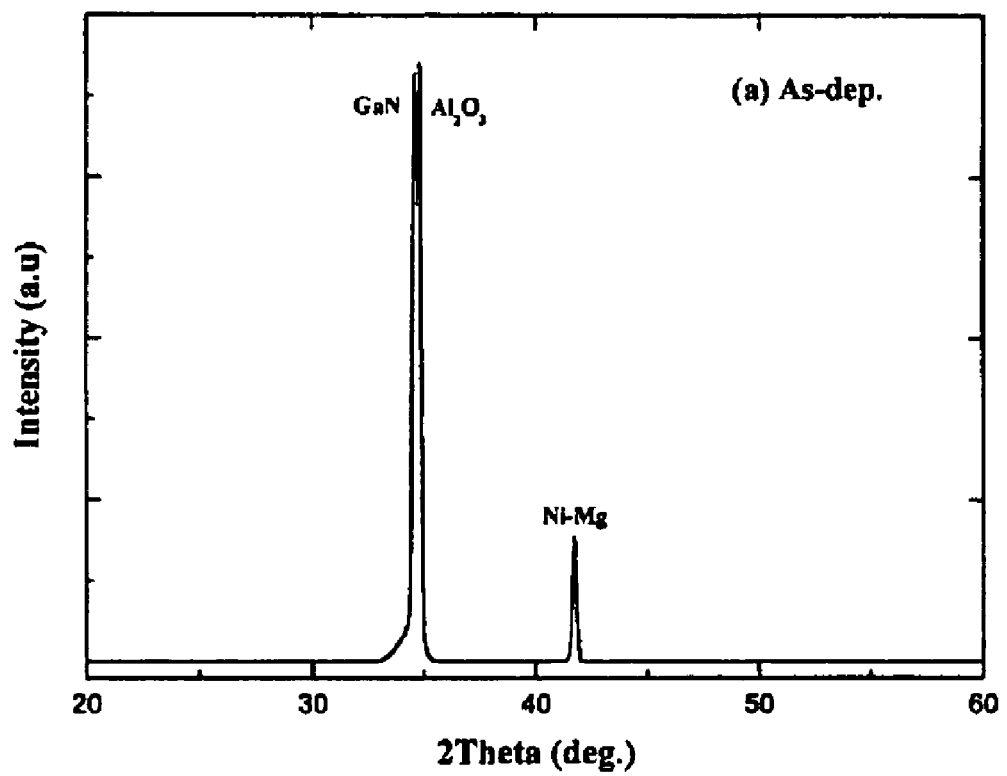
FIG. 4 is XRD graphs of a nickel-magnesium (Ni—Mg) solid solution used for fabricating a thin film electrode according to an embodiment of the present invention.
Figure 4:
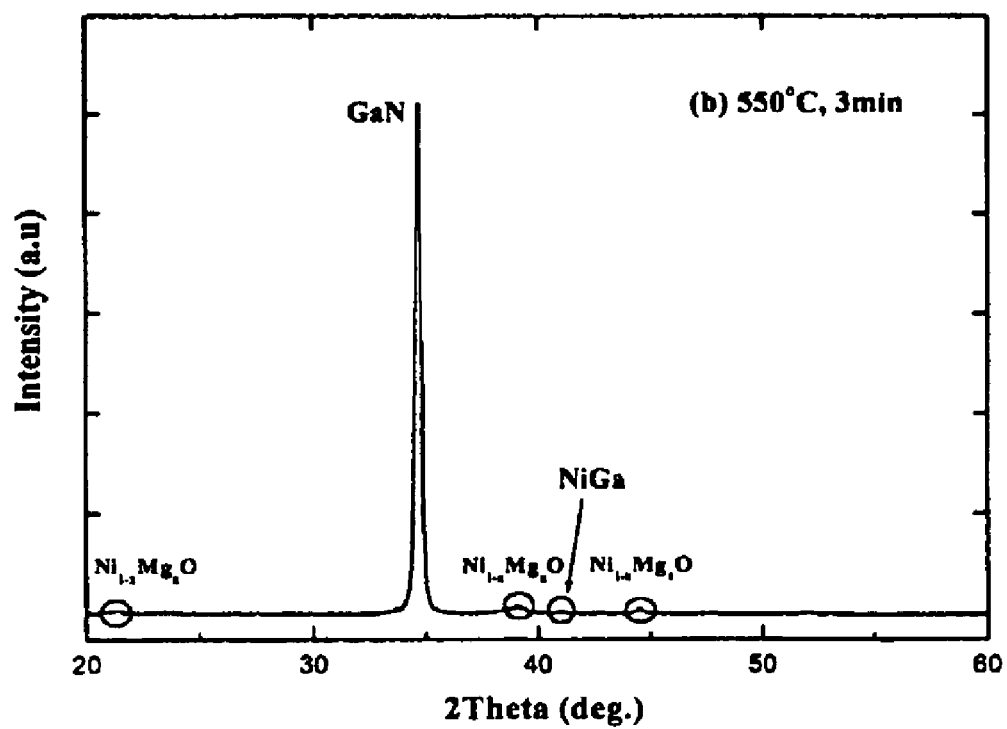

FIG. 4 is XRD graphs of a nickel-magnesium (Ni—Mg) solid solution used for fabricating a thin film electrode according to an embodiment of the present invention. FIG. 4(a) represents the results prior to annealing, and FIG. 4(b) represents the results after annealing at 550° C. for 1 minute.

From the graph of FIG. 4(a), peaks corresponding to the p-type gallium nitride (GaN) and a sapphire ($Al_2O_3$) substrate were observed. In addition, a peak corresponding to the nickel-magnesium (Ni—Mg) solid solution prepared by adding nickel (Ni) to magnesium (Mg) was observed.

That is, since the nickel-magnesium solid solution has a strong hydrogen affinity, it breaks Mg—H bonds when contacted with the top of the p-type gallium nitride layer and thus increases the carrier concentration on the surface of the gallium nitride layer.

From FIG. 4(b), in addition to a peak corresponding to the p-type gallium nitride (GaN), peaks corresponding to an oxidized Ni—Mg—O solid solution ($Ni_{1-x}Mg_xO$) which is an oxidized state of the Ni—Mg solid solution prior to annealing, and NiGa as a nickel-gallium compound, were observed.

In particular, the oxidized solid solution is a conductive oxide, and expected to have a large work function compared to nickel oxide (NiO) of a conventional nickel/gold (Ni/Au) structure. In addition, the oxidized solid solution provides a number of holes to the surface of the gallium nitride and at the same time lowers the Schottky barrier so as to cause exhibition of excellent electrical properties. Furthermore, it can be inferred that the oxidized nickel-magnesium solid solution plays a central role in enhancing the transparency of the thin metal film.

Figure 5:
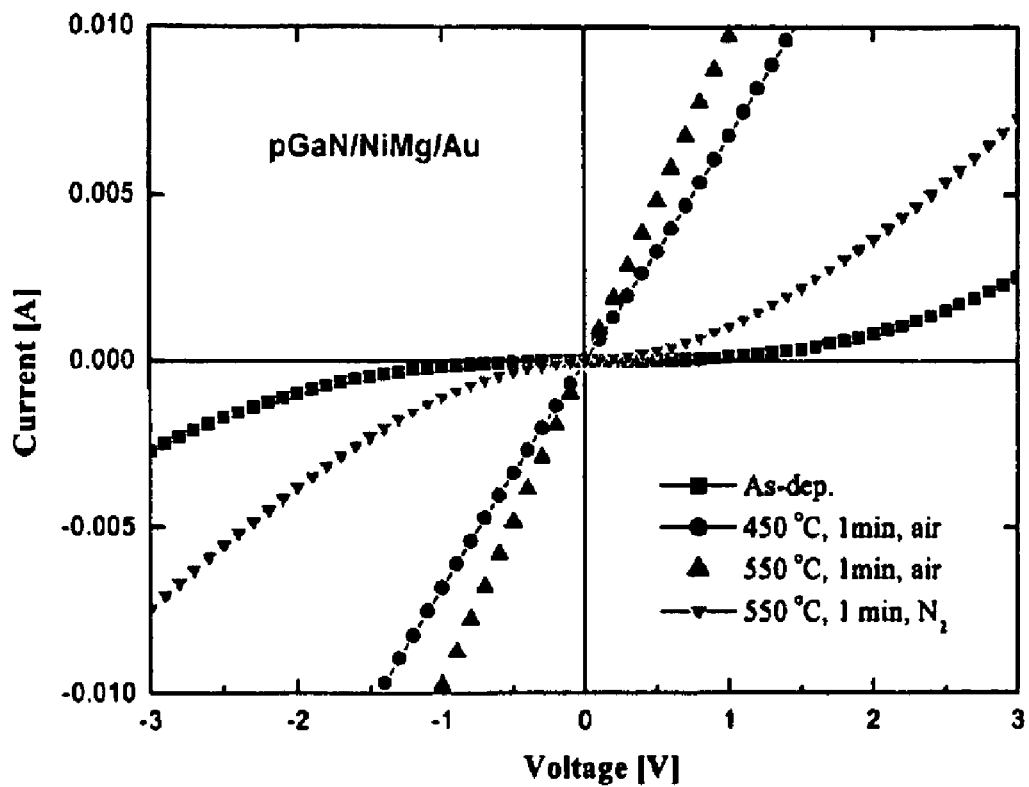
FIG. 5 is a graph showing current-voltage characteristics before and after annealing, following depositing a nickel-magnesium (Ni—Mg) solid solution/gold (Au) on a p-type gallium nitride layer having a carrier concentration of $5\times10^{17}$ in accordance with an embodiment of the present invention.

FIG. 5 is a graph showing current-voltage characteristic before and after annealing, following depositing a nickel-magnesium (Ni—Mg) solid solution/gold (Au) on a p-type gallium nitride layer having a carrier concentration of $5 \times 10^{17}$ in accordance with an embodiment of the present invention.

Current-voltage characteristics were measured after annealing at temperatures of 450° C. and 550° C. in air for 1 minute, respectively. The current-voltage measurement showed a specific contact resistance of $8.45 \times 10^{-6}$ $cm^2$ and $6.08 \times 10^{-6}$ $cm^2$ at each temperature. The graph obtained in air shows a linear curve which distinctly indicates a good ohmic contact, while the graph obtained under nitrogen shows a non-linear curve which shows a rectifying contact.

Figure 6:
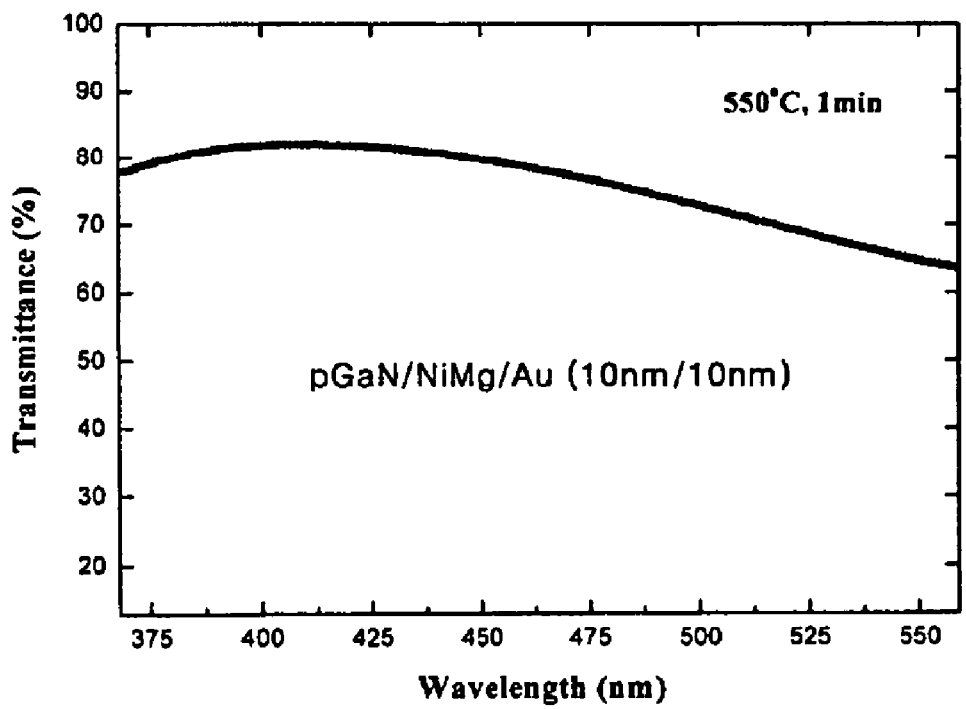
FIG. 6 is a graph showing results of the transmittance measured after annealing, following depositing a nickel-magnesium (Ni—Mg) solid solution/gold (Au) on a Corning glass in accordance with an embodiment of the present invention.

FIG. 6 is a graph showing results of the transmittance measured after annealing at 550° C. for 1 minute, following depositing a nickel-magnesium (Ni—Mg) solid solution/gold (Au) on Corning glass in accordance with an embodiment of the present invention.

The deposited Ni—Mg solid solution/Au showed a transmittance of 80% or more at a wavelength range of 370~450 nm. Typical metal electrode layers and capping layer deposited for the measurement of transmittance have a thickness of 100 Å or less, while the metal electrode layers and the capping layer used in the present invention have a thickness of about 200 Å. Despite such a large thickness, the electrode layers and capping layer exhibit a transparence of at least 80%. The term 'capping layer' used herein refers to an outermost electrode layer.

Figure 7:
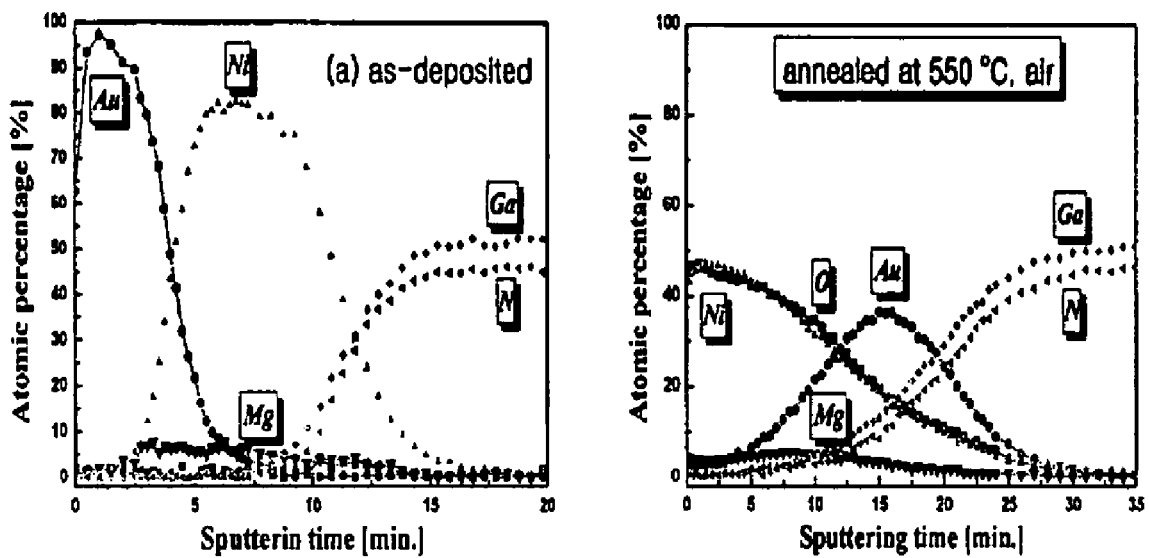
FIG. 7 is graphs showing the AES (Atomic Emission Spectrometer) depth profiles of a nickel-magnesium (Ni—Mg) solid solution used for fabricating a thin film electrode according to a preferred embodiment of the present invention.

FIG. 7 is graphs showing the AES (Auger Electron Spectroscopy) depth profile of a nickel-magnesium (Ni—Mg) solid solution used for fabricating a thin film electrode according to a preferred embodiment of the present invention. FIG. 7(a) represents the results prior to annealing, and FIG. 7(b) represents the results after annealing at 550° C. for 1 minute;

From FIG. 7(a), it was observed that nickel (Ni) and a small amount of magnesium (Mg) remain on the surface of the gallium nitride layer. Although not shown in FIG. 7(a), the AES data related with magnesium (Mg) reveals that magnesium (Mg) is solubilized in nickel (Ni), rather than is formed into a compound through a reaction with nickel (Ni). FIG. 7(b) apparently shows that the nickel-magnesium solid solution is formed and at the same time an extremely small amount of magnesium is diffused into the surface of gallium nitride and distributed.

Figure 8:
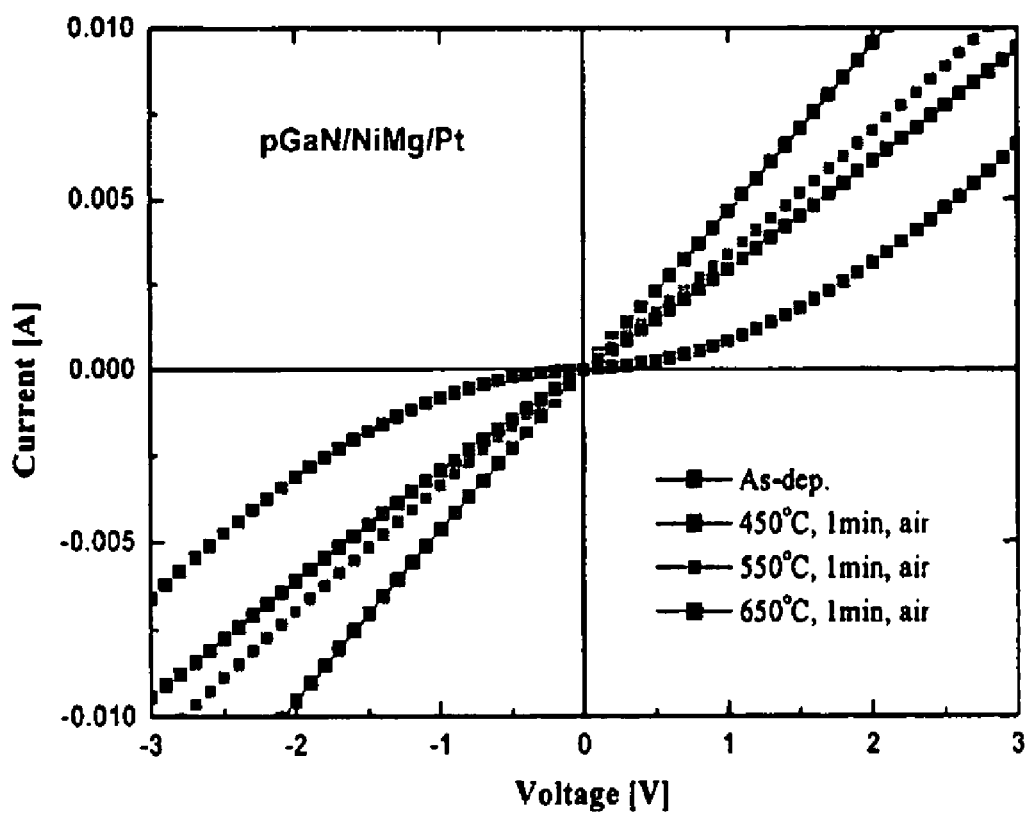
FIG. 8 is a graph showing current-voltage characteristic before and after annealing, following depositing a nickel-magnesium (Ni—Mg) solid solution/platinum (Pt) on a p-type gallium nitride layer having a carrier concentration of $5\times10^{17}$ in accordance with an embodiment of the present invention.

FIG. 8 is a graph showing current-voltage characteristic before and after annealing in air, following depositing a nickel-magnesium (Ni—Mg) solid solution/platinum (Pt) on a p-type gallium nitride layer having a carrier concentration of $5 \times 10^{17}$ in accordance with an embodiment of the present invention.

After the deposited Ni—Mg solid solution/Pt was annealed at 450~650° C. for 1 minute, current-voltage characteristics were measured. As a result, a distinctly linear curve was obtained. The linear curve indicates that the ohmic contact resistance obtained at a level of $10^{-5}$~$10^{-6}$ $cm^2$ represents a good ohmic contact.

Figure 9:
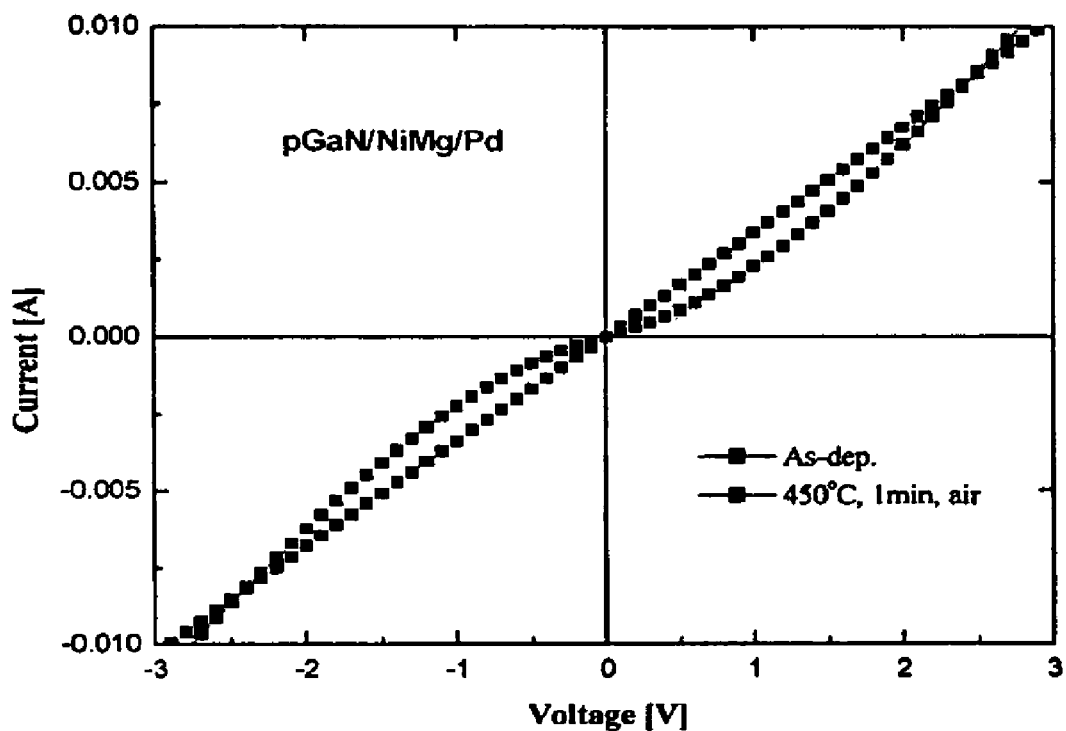
FIG. 9 is a graph showing current-voltage characteristics before and after annealing, following depositing a nickel-magnesium (Ni—Mg) solid solution/palladium (Pd) on a p-type gallium nitride layer having a carrier concentration of $5\times10^{17}$ in accordance with an embodiment of the present invention.

FIG. 9 is a graph showing current-voltage characteristics before and after annealing in air, following depositing a nickel-magnesium (Ni—Mg) solid solution/palladium (Pd) on a p-type gallium nitride layer having a carrier concentration of $5 \times 10^{17}$ in accordance with an embodiment of the present invention.

After the deposited Ni—Mg solid solution/Pd was annealed at 450° C. for 1 minute, current-voltage characteristics were measured. As a result, a distinctly linear curve was obtained. The linear curve indicates that the ohmic contact resistance obtained at a level of $10^{-5}$ $cm^2$ represents a good ohmic contact.

Figure 10:
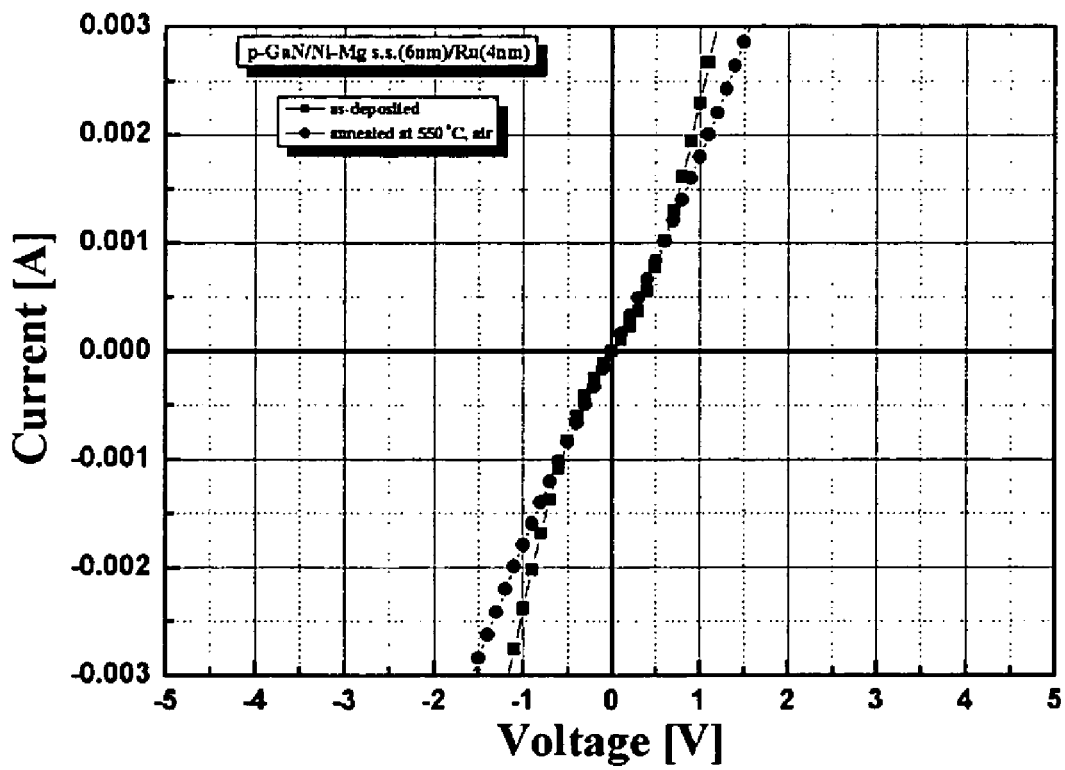
FIG. 10 is a graph showing current-voltage characteristics before and after annealing in air, following depositing a nickel-magnesium (Ni—Mg) solid solution/ruthenium (Ru) on a p-type gallium nitride layer having a carrier concentration of $5\times10^{17}$.

FIG. 10 is a graph showing current-voltage characteristics before and after annealing in air, following depositing a nickel-magnesium (Ni—Mg) solid solution/ruthenium (Ru) on a p-type gallium nitride layer having a carrier concentration of $5 \times 10^{17}$ in accordance with an embodiment of the present invention.

Figure 11:
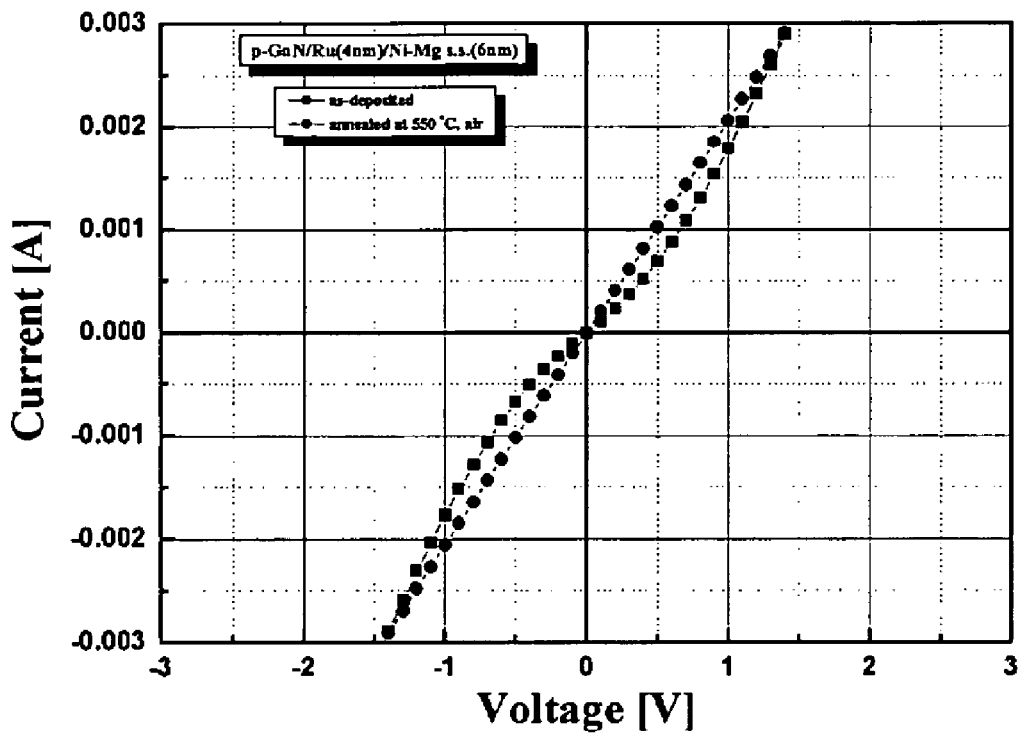
FIG. 11 is a graph showing current-voltage characteristics before and after annealing in air, following depositing a ruthenium (Ru)/nickel-magnesium (Ni—Mg) solid solution on a p-type gallium nitride layer having a carrier concentration of $5\times10^{17}$.

FIG. 11 is a graph showing current-voltage characteristics before and after annealing in air, following depositing a ruthenium (Ru)/nickel-magnesium (Ni—Mg) solid solution on a p-type gallium nitride layer having a carrier concentration of $5 \times 10^{17}$ in accordance with an embodiment of the present invention.

Figure 12:
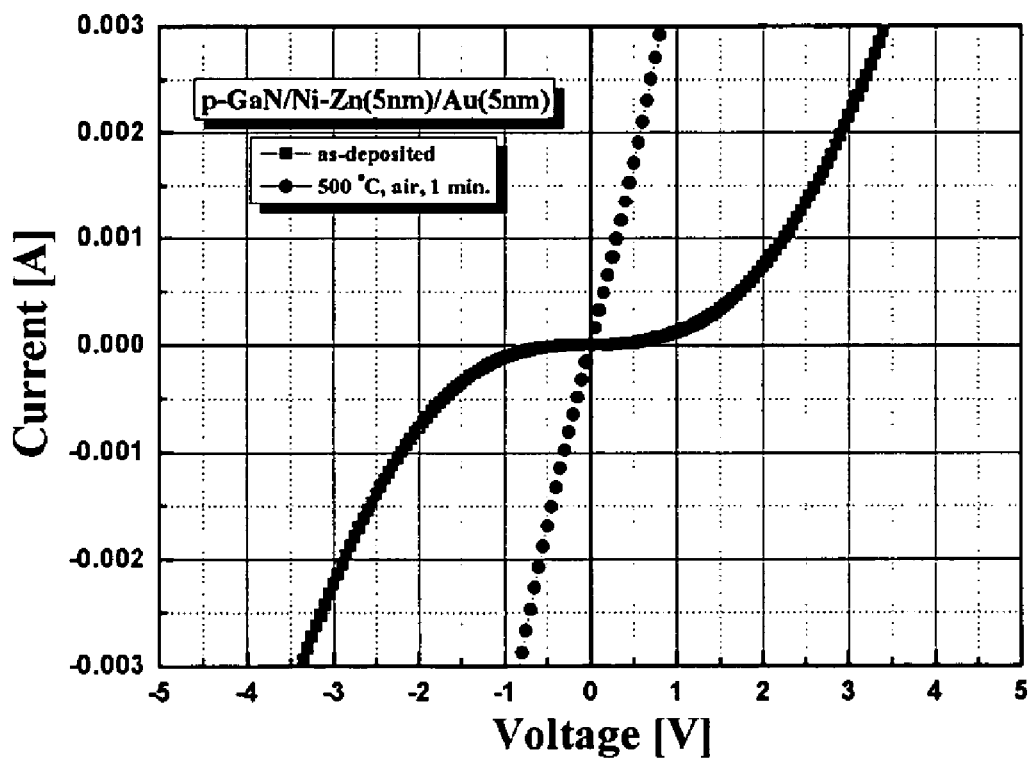
FIG. 12 is a graph showing current-voltage characteristics before and after annealing in air, following depositing a nickel-zinc (Ni—Zn) solid solution/gold (Au) on a p-type gallium nitride layer having a carrier concentration of $5\times10^{17}$.

There is a need to compare the results shown in FIGS. 11 and 12 with conventional ohmic structures of nickel/ruthenium (Ni/Ru) and ruthenium/nickel (Ru/Ni). In particular, when annealed at 550° C. for 1 minute, the current-voltage characteristics of the nickel/ruthenium (Ni/Ru) ohmic structure was identified to be difficult structures to form an ohmic contact. From the graphs of FIGS. 11 and 12, linear curves showing that the ohmic contact resistance obtained at a level of $10^{-5}$ $cm^2$ represents a good ohmic contact were obtained by the addition of magnesium.

FIG. 12 is a graph showing current-voltage characteristic before and after annealing in air, following depositing a nickel-zinc (Ni—Zn) solid solution/gold (Au) on a p-type gallium nitride layer having a carrier concentration of $5\times10^{17}$ in accordance with an embodiment of the present invention.

After the deposited nickel-zinc (Ni—Zn) solid solution/gold (Au) was annealed at 500° C. for 1 minute, current-voltage characteristics were measured. As a result, a distinctly linear curve was obtained. The linear curve indicates that the ohmic contact resistance obtained at a level of $10^{-5}$ cm$^2$ represents a good ohmic contact.

Figure 13:
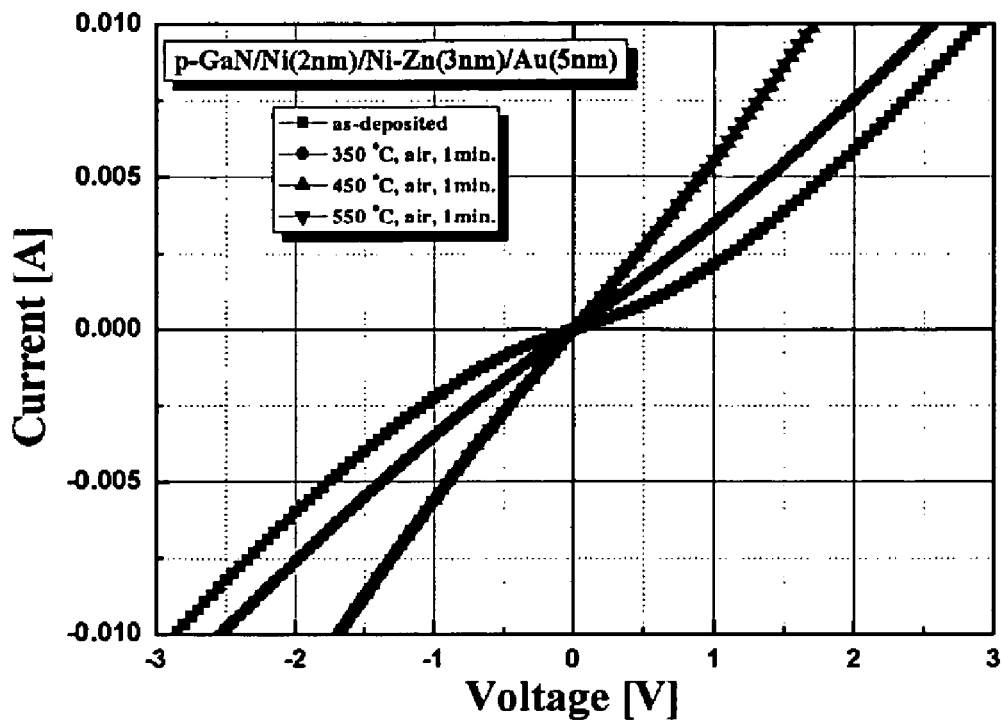
FIG. 13 is a graph showing current-voltage characteristics before and after annealing in air, following depositing a pure nickel (Ni)/nickel-zinc (Ni—Zn) solid solution/gold (Au) on a p-type gallium nitride layer having a carrier concentration of $5\times10^{17}$.

FIG. 13 is a graph showing current-voltage characteristic before and after annealing in air, following depositing a pure nickel (Ni)/nickel-zinc (Ni—Zn) solid solution/gold (Au) on a p-type gallium nitride layer having a carrier concentration of $5\times10^{17}$ in accordance with an embodiment of the present invention.

After the deposited pure nickel (Ni)/nickel-zinc (Ni—Zn) solid solution/gold (Au) was annealed at 500° C. for 1 minute, current-voltage characteristic was measured. As a result, a distinctly linear curve was obtained. The linear curve indicates that the ohmic contact resistance obtained at a level of $10^{-6}$ cm$^2$ represents a good ohmic contact.

Figure 14:
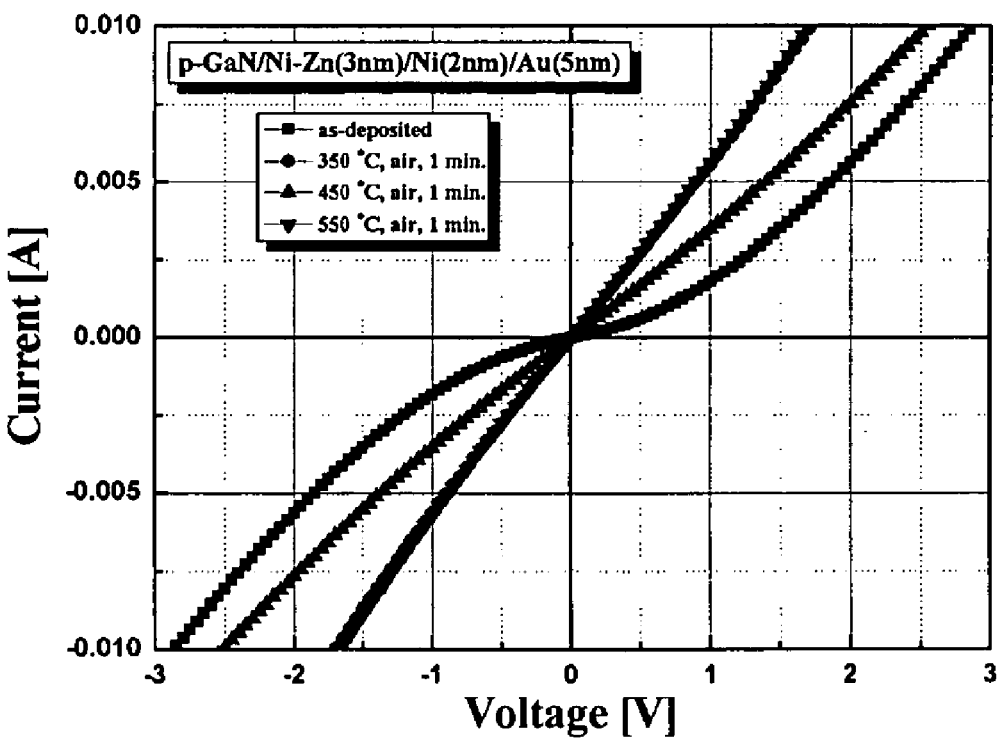
FIG. 14 is a graph showing current-voltage characteristics before and after annealing in air, following depositing a nickel-zinc (Ni—Zn) solid solution/nickel (Ni)/gold (Au) on a p-type gallium nitride layer having a carrier concentration of $5\times10^{17}$.

FIG. 14 is a graph showing current-voltage characteristic before and after annealing in air, following depositing a nickel-zinc (Ni—Zn) solid solution/nickel (Ni)/gold (Au) on a p-type gallium nitride layer having a carrier concentration of $5\times10^{17}$ in accordance with an embodiment of the present invention.

After the deposited nickel-zinc (Ni—Zn) solid solution/nickel (Ni)/gold (Au) was annealed at 500° C. for 1 minute, current-voltage characteristics were measured. As a result, a distinctly linear curve was obtained. The linear curve indicates that the ohmic contact resistance obtained at a level of $10^{-6}$ cm$^2$ represents a good ohmic contact.

Hereinafter, the present invention will be described in more detail with reference to the following Examples. However, these Examples are given for the purpose of illustration and are not to be construed as limiting the scope of the invention.

EXAMPLE 1

A p-type gallium nitride (GaN) layer was placed in an ultrasonic bath, and then washed at 60° C. for 5 minutes using trichloroethylene, acetone, methanol and distilled water, respectively. The washed p-type gallium nitride layer was subjected to a hard baking process at 100° C. for 10 minutes to completely remove moisture remaining on the p-type gallium nitride layer. A Photoresist was spin-coated at 4,000 rpm onto the p-type gallium nitride layer, and then subjected to a soft baking process at 88° C. for 10 minutes. In order to develop a mask pattern on the p-type gallium nitride layer, a mask was aligned with the GaN layer and exposed to a UV light at an intensity of 22.8 mW for 10 seconds, the resulting structure was dipped in a mixture of a developing agent and distilled water (1:4), and developed for 15 seconds.

Thereafter, the developed sample was dipped in BOE solution for 5 minutes to remove contaminants remaining on the sample. A nickel-magnesium (Ni—Mg) solid solution/gold (Au) was deposited on the developed sample in a thickness of 100 Å using an electron-beam evaporator, and then subjected to a lift-off process using acetone. The resulting structure was charged into a rapid thermal annealing (RTA) furnace and annealed under air or nitrogen gas at 350~550° C. for 1 minute to fabricate a high-grade thin film electrode for forming an ohmic contact.

EXAMPLE 2

A procedure was performed in the same manner as in Example 1 up to the step of depositing a Ni—Mg solid solution. Thereafter, platinum (Pt) was deposited using an electron-beam evaporator to form a capping layer in a thickness of 100 Å, and then subjected to a lift-off process using acetone. The resulting structure was charged into a rapid thermal annealing (RTA) furnace and annealed in air at 450~650° C. for 1 minute to fabricate a thin metal film for forming an ohmic contact.

EXAMPLE 3

A procedure was performed in the same manner as in Example 1 up to the step of depositing a Ni—Mg solid solution. Thereafter, palladium (Pd) was deposited using an electron-beam evaporator to form a capping layer in a thickness of 100 Å, and then subjected to a lift-off process using acetone. The resulting structure was charged into a rapid thermal annealing (RTA) furnace and annealed in air at 450° C. for 1 minute to fabricate a thin metal film for forming an ohmic contact.

EXAMPLE 4

A procedure was performed in the same manner as in Example 1 up to the step of depositing an electrode layer on a gallium nitride layer. Thereafter, ruthenium (Ru), a nickel-magnesium (Ni—Mg) solid solution and gold (Au) were sequentially deposited in thicknesses of 50 Å and 50 Å, respectively, using an electron-beam evaporator and then subjected to a lift-off process using acetone. The resulting structure was charged into a rapid thermal annealing (RTA) furnace and annealed in air at 350~650° C. for 1 minute to fabricate a thin metal film for forming an ohmic contact.

EXAMPLE 5

A procedure was performed in the same manner as in Example 1 up to the step of depositing a Ni—Mg solid solution in a thickness of 50 Å. Thereafter, ruthenium (Ru) was deposited using an electron-beam evaporator to form a capping layer in a thickness of 50 Å, and then subjected to a lift-off process using acetone. The resulting structure was charged into a rapid thermal annealing (RTA) furnace and annealed in air at 450° C. for 1 minute to fabricate a thin metal film for forming an ohmic contact.

EXAMPLE 6

A procedure was performed in the same manner as in Example 1 up to the step of depositing a Ni—Zn solid solution in a thickness of 50 Å. Thereafter, gold (Au) was deposited using an electron-beam evaporator to form a capping layer in a thickness of 50 Å, and then subjected to a lift-off process using acetone. The resulting structure was charged into a rapid thermal annealing (RTA) furnace and annealed in air at 350~650° C. for 1 minute to fabricate a thin metal film for forming an ohmic contact.

EXAMPLE 7

A procedure was performed in the same manner as in Example 1 up to the step of depositing a Ni—Zn solid solution in a thickness of 30 Å. Thereafter, nickel (Ni) and gold (Au) were deposited in thicknesses of 20 Å and 50 Å, respectively, using an electron-beam evaporator, and then subjected to a lift-off process using acetone. The resulting structure was charged into a rapid thermal annealing (RTA) furnace and annealed in air at 350~650° C. for 1 minute to fabricate a thin metal film for forming an ohmic contact.

EXAMPLE 8

A procedure was performed in the same manner as in Example 1 up to the step of depositing an electrode layer on a gallium nitride layer. Thereafter, nickel (Ni), a nickel-zinc (Ni—Zn) solid solution and gold (Au) were sequentially deposited in thicknesses of 20 Å, 30 Å and 50 Å, respectively, using an electron-beam evaporator and then subjected to a lift-off process using acetone. The resulting structure was charged into a rapid thermal annealing (RTA) furnace and annealed in air at 350~650° C. for 1 minute to fabricate a thin metal film for forming an ohmic contact.

As apparent from the above description, when a nickel (Ni)-based solid solution to be used as a metal electrode layer is deposited on a gallium nitride layer and then annealed near the melting point of a solubilized metal element such as magnesium (Mg) or zinc (Zn), an excellent doping effect of magnesium (Mg) and zinc (Zn) on the surface of the gallium nitride layer can be obtained, effective carrier concentration around the surface of the gallium nitride layer can be increased by the formation of a number of gallium vacancies due to reaction with gallium, or an energy band between the gallium nitride and deposited oxidized material can be controlled. These improvements allow the high-grade ohmic contact system of the present invention to exhibit excellent current-voltage characteristics and a low specific contact resistance, as well as a high transmittance in the short-wavelength region.

In addition, the thin film electrode for forming an ohmic contact of the present invention is expected to exhibit excellent electrical and optical properties such as low specific contact resistance, excellent current-voltage characteristics, good surface state and high transparence, in particular improved current injection and spreading capabilities. Accordingly, since the thin film electrode for forming an ohmic contact of the present invention can considerably improve electrical and optical efficiencies of gallium nitride light emitting diodes (LEDs) and laser diodes (LDs), it can be utilized in the development of light emitting diodes and laser diodes with high quality in the near future.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a thin film electrode on a p-type gallium nitride layer, comprising the steps of:
    washing carbon and oxygen layers formed on a gallium nitride semiconductor to remove impurities therefrom;
    depositing an Ni-X solid solution, wherein X is Mg, Be, Ca, Zn under a high vacuum of $2 \times 10^{-6}$ ~$5 \times 10^{-8}$ torr using an electron beam evaporation, an electron ray evaporation, a sputtering process, a plasma laser deposition or an electrochemical process; and
    annealing the deposited nickel-based solid solution under air, oxygen or nitrogen atmosphere at 250~800° C. for 30 seconds~1 hour.

2. The method of claim 1, wherein the Ni-based solid solution includes nickel as a matrix metal and x including at least one element selected from the group consisting of Group VI elements.

3. The method of claim 2, wherein the Group VI elements include one element selected from the group consisting of S, Se and Te.

4. The method of claim 1, wherein the Ni-based solid solution includes nickel as a matrix metal, and x including at least one element selected from the group consisting of Sc, Y, Ge, Sn and Sb.

5. The method of claim 1, wherein an x element constituting the Ni-based (Ni-x) solid solution is added in the amount of 1-49 atomic percent (%).

6. The method of claim 1, further comprising forming electrode layers from the Ni-based solid solution having a thickness of 1-1000 Å.

7. The method of claim 1, wherein the result of the annealing step is a first electrode layer laminated on the p-type gallium nitride layer and includes the Ni-x solid solution;
    further comprising forming a second electrode layer on the first electrode layer including at least one element selected from the group consisting of Au, Pt, Pd, Ni, Ru, Rh, Re, C, Cu and Ir.

8. The method of claim 7, further comprising forming a third electrode layer on the second electrode layer and including at least one element selected from the group consisting of Al, Ag, Rh, transparent conductive oxide, and transparent conductive nitrides.

9. The method of claim 8, further comprising forming a fourth electrode layer on the third electrode layer and including at least one element selected from the group of Al, Ag and Rh.

* * * * *